United States Patent [19]
Grossman et al.

[11] Patent Number: 5,294,847
[45] Date of Patent: Mar. 15, 1994

[54] LATCHING SENSE AMPLIFIER

[75] Inventors: Anita S. Grossman; Paul A. Reed, both of Austin, Tex.

[73] Assignee: Motorola, Inc., Schaumburg, Ill.

[21] Appl. No.: 937,091

[22] Filed: Aug. 31, 1992

[51] Int. Cl.⁵ ............................. G11C 7/00; H03F 3/45
[52] U.S. Cl. ..................... 307/530; 307/279; 365/205
[58] Field of Search ............... 307/530, 279; 365/207, 365/208, 205

[56] References Cited

U.S. PATENT DOCUMENTS

| | | | |
|---|---|---|---|
| 4,247,791 | 1/1981 | Rovell | 307/530 |
| 4,253,163 | 2/1981 | Komoriya et al. | 307/530 |
| 4,831,287 | 5/1989 | Golab | 365/207 |
| 4,845,675 | 7/1989 | Krenik et al. | 365/205 |
| 5,015,891 | 5/1991 | Choi | 307/530 |
| 5,057,718 | 10/1991 | Proebsting | 307/530 |
| 5,097,157 | 3/1992 | Jaffe et al. | 307/530 |
| 5,160,861 | 11/1992 | Lee | 307/530 |
| 5,248,946 | 9/1993 | Murakami et al. | 365/205 |

Primary Examiner—William L. Sikes
Assistant Examiner—Toan Tran
Attorney, Agent, or Firm—Lee E. Chastain

[57] ABSTRACT

A latching sense amplifier (10) has sensing circuitry (12 and 14), latching circuitry (16) and switching circuitry (18). The sense amplifier operates between a first and a second voltage supply level and receives two input voltage levels. In a first mode, the sensing circuitry (12 and 14) generates two AC symmetric outputs representative of the voltage differential between the two input voltages. In a second mode, the latching circuitry (16) receives the two AC symmetric outputs and generates a second pair of outputs. The second pair of outputs is also representative of the voltage differential between the two input voltages. The voltage differential between the second pair of outputs is generally equal to the voltage differential between the first and second voltage supply levels. The switching circuitry (18) configures the sensing circuitry (12 and 14) to operate in conjunction with the latching circuitry (16) to form a cross coupled latch in the second mode. The switching circuitry is responsive to a timing signal.

15 Claims, 2 Drawing Sheets

5,294,847

LATCHING SENSE AMPLIFIER

FIELD OF THE INVENTION

The present invention generally relates to sensing circuits for a memory or a data processing system, and more specifically to a sensing circuit that provides a latched output.

BACKGROUND OF THE INVENTION

Advances in semiconductor products are continually requiring smaller and faster devices. Smaller device size allows more functions to be integrated into a single device. Faster devices result in higher throughput for a given system. Unfortunately, these goals are often mutually exclusive given standard circuit designs.

Sense amplifiers are devices particularly driven by technology to smaller and faster implementations. Sense amplifiers detect small voltage differences between two input signals and generate an output representative of which of the two inputs is greater. Sense amplifiers are widely used in memory systems to determine what logic level a memory cell represents given the two output voltages from the cell. Sense amplifiers are also difficult to design both smaller and faster. Faster sense amplifiers may be designed with an associated latch to increase the speed of combination of the latch and amplifier. The combination circuit, however, requires additional layout space. Conversely, small sense amplifiers typically do not meet very high speed performance criteria.

SUMMARY OF THE INVENTION

In accordance with the present invention, there is disclosed a latching sense amplifier which substantially eliminates disadvantages of prior sense amplifiers.

A latching sense amplifier has sensing circuitry, latching circuitry and switching circuitry. The sense amplifier operates between a first and a second voltage supply level and receives two input voltage levels. In a first mode, the sensing circuitry generates two AC symmetric outputs representative of the voltage differential between the two input voltages. In a second mode, the latching circuitry receives the two AC symmetric outputs and generates a second pair of outputs. The second pair of outputs is also representative of the voltage differential between the two input voltages. The voltage differential between the second pair of outputs is generally equal to the voltage differential between the first and second voltage supply levels. The switching circuitry configures the sensing circuitry to operate in conjunction with the latching circuitry to form a latch in the second mode. The switching circuitry is responsive to a timing signal.

BRIEF DESCRIPTION OF THE DRAWINGS

The features and advantages of the present invention will be more clearly understood from the following detailed description taken in conjunction with the accompanying FIGURES where like numerals refer to like and corresponding parts and in which.

DETAILED DESCRIPTION OF A PREFERRED EMBODIMENT

Figure 1:
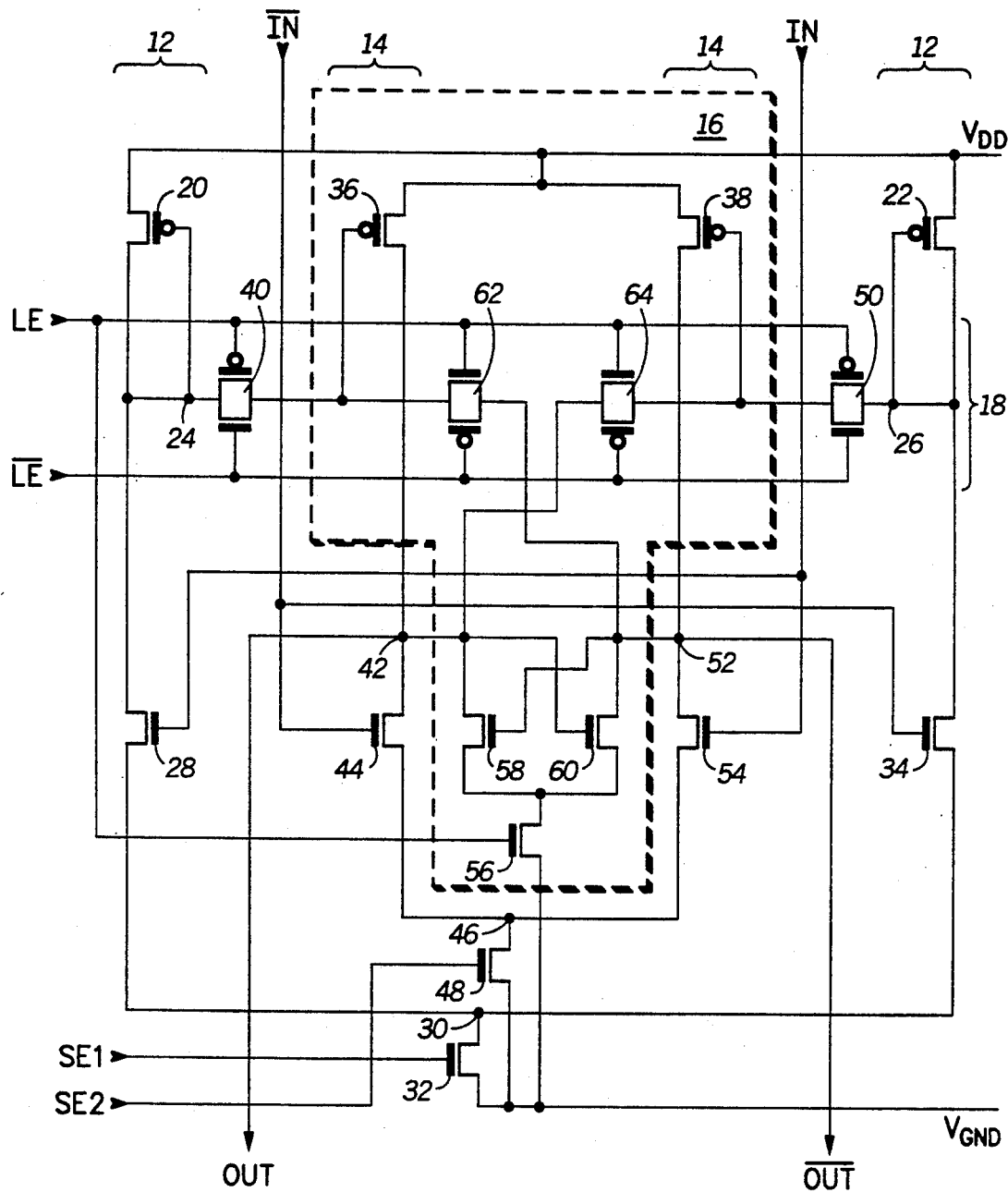
FIG. 1 depicts a schematic diagram of a first embodiment of a latching sense amplifier constructed in accordance with the present invention.

FIG. 1 depicts a schematic diagram of a first embodiment of a latching sense amplifier 10 (hereinafter simply "sense amp 10") constructed in accordance with the present invention. Sense amp 10 is designed to operate between two voltage supply levels, here $V_{DD}$ and $V_{GND}$. Typically the difference between these two voltage supply levels is 3.3 or 5 volts. Supply voltage differentials less than 3.3 volts or greater than 5 volts may be used depending upon process limitations and transistor details. Sense amp 10 has a first differential input stage 12, a second differential input stage 14, a latch 16 and a switching circuit 18 for alternately modifying the configuration of sense amp 10 from an amplifier to a latch.

Sense amp 10 generates a pair of outputs that are representative of the voltage differential between two input voltage levels, here IN and $\overline{IN}$. For instance, if the input voltage IN is greater than the input voltage $\overline{IN}$, then an output OUT will be a high logic level and an output $\overline{OUT}$ will be a low logic level. Conversely, if the input voltage IN is less than the input voltage $\overline{IN}$, then the output OUT will be a low logic level and the output $\overline{OUT}$ will be a high logic level. The connection of the inputs to the first and second differential input stages and the connection of the second differential input stage to latch 16 cause sense amp 10 to have a symmetric alternating current ("AC") gain. A symmetric gain enables sense amp 10 to be used in applications where speed is critical. The integration of latch 16 with the differential input stage 14 further increases the speed and decreases the size of sense amp 10 relative to a comparable sensing system.

First differential input stage 12 has a transistor 20 and a transistor 22. Transistors 20 and 22 are each connected as diodes. Transistors 20 and 22 each have their drains connected to a positive voltage supply, $V_{DD}$. The gate and source of transistor 20 are connected to a node 24. The gate and source of transistor 22 are connected to a node 26. Node 24 is connected to the drain of a transistor 28. The gate of transistor 28 is connected to the input signal, IN. The source of transistor 30 is connected to a node 30. Node 30 is connected to the source of a first enabling transistor 32. First enabling transistor 32 has its gate connected to a timing signal, switch enable-1 (labeled "SE1"). The source of first enabling transistor 32 is connected to a second reference voltage, $V_{GND}$. Node 26 is connected to the drain of a transistor 34. The gate of transistor 34 is connected to the input signal, $\overline{IN}$. The source of transistor 34 is connected to node 30. Nodes 24 and 26 are the outputs of first differential input stage 12. As depicted, transistors 20 and 22 are p channel transistors. All other transistors in first differential input stage 12 are n channel transistors.

Second differential input stage 14 has a transistor 36 and a transistor 38. Transistors 36 and 38 each have their drains connected to a positive voltage supply, $V_{DD}$. The gate of transistor 36 is connected to node 24 through a pass gate 40. As depicted, pass gate 40 conducts when the timing signal latch enable (labeled "LE") is a logic low and the timing signal latch enable bar (labeled "$\overline{LE}$") is a logic high. The source of transistor 36 is connected to a node 42. Node 42 is connected to the drain of a transistor 44. The gate of transistor 44 is connected to the input signal, $\overline{IN}$. The source of transistor 44 is connected to a node 46. Node 46 is connected to the drain of a second enabling transistor 48. Second enabling transistor 48 has its gate connected to a timing signal, switch enable-2 (labeled "SE2"). The source of second enabling transistor 48 is connected to second reference voltage, $V_{GND}$. The gate of transistor 38 is connected to node 26 through a pass gate 50. As depicted, pass gate 50 conducts when the timing signal latch enable (labeled "LE") is a logic low and the timing signal latch enable bar (labeled "$\overline{LE}$") is a logic high. The source of transistor 38 is connected to a node 52. Node 52 is connected to the drain of a transistor 54. The gate of transistor 54 is connected to the input signal, IN. The source of transistor 54 is connected to node 46. Nodes 42 and 52 are the outputs of second differential input stage 14. As depicted, transistors 36 and 38 are p channel transistors. All other transistors in second differential input stage 14 are n channel transistors.

Latch 16 has four cross-coupled transistors and a latch enabling transistor 56. The first two cross-coupled transistors of latch 16 have been partially described above in connection with second differential input stage 14. In particular, transistors 36 and 38 act in conjunction with a transistor 58 and a transistor 60 to form a cross-coupled latch in certain operating modes as will be described below. The drain of transistor 58 is connected to node 42 and its gate is connected to node 52. Conversely, the drain of transistor 60 is connected to node 52 and its gate is connected to node 42. The sources of both transistors 58 and 60 are connected to the drain of latch enabling transistor 56. The gate of latch enabling transistor 56 is connected to the timing signal latch enable. The source of latch enabling transistor 56 is connected to second reference voltage $V_{GND}$. A pass gate 62 connects the gate of transistor 36 to node 52 when the timing signal LE is high and the timing signal $\overline{LE}$ is low. A pass gate 64 connects the gate of transistor 38 to node 42 when the timing signal LE is high and the timing signal $\overline{LE}$ is low.

Switching circuit 18, in the depicted embodiment, has four pass gates 40, 50, 62 and 64. The connection of these four gates is described above in connection with the first and second differential input stages and in connection with latch 16. In the described embodiment, pass gates 40, 50, 62 and 64 each combine a p channel and an n channel transistor. In other implementations, both transistors may not be necessary at each location for the proper operation of sense amp 10. In general, any type of switch may be used that alternately makes or breaks a connection as described below.

The output of sense amp 10, OUT and $\overline{OUT}$, is generated at nodes 42 and 52, respectively.

The operation of sense amp 10 is characterized by three phases: set-up, sense enable and latch enable. These three phases are determined by the logic levels present on the timing signals LE, SE1 and SE2. As is customary terminology in the art, the timing signal $\overline{LE}$ is the logical inverse of the timing signal LE. It is therefore not an independent timing signal. During the first phase, the set-up phase, SE1 is high and SE2 and LE are low. During the second phase, the sense enable phase, SE1 and SE2 are high and LE is low. During the third phase, the latch enable phase, SE1 and SE2 are low and LE is high.

In the set-up phase of operation, a high logic level on SE1 places first enabling transistor 32 into a conducting state. First enabling transistor 32 electrically short circuits node 30 to $V_{GND}$. This enables first differential input stage 12. First enabling transistor 32 causes transistors 28 and 34 to source a finite amount of current to $V_{GND}$. The particular amount of current depends upon the voltages present on the input signals IN and $\overline{IN}$. In general, the input having a higher voltage level will cause the transistor to which it is connected to conduct more than the transistor connected to the input having the lower voltage level. The more conducting transistor will cause the node connected to its drain to have a lower voltage than the node connected to the drain of the less conducting transistor. For instance, if the input signal IN is greater than the input signal $\overline{IN}$, then transistor 28 will be placed into a more conducting state than transistor 34. This will cause node 24 to drop to a lower voltage than node 26. The voltage differential between nodes 24 and 26 will be greater than the voltage differential between the two inputs IN and $\overline{IN}$. The voltages at nodes 24 and 26 may be advantageously used to bias the gates of transistors 36 and 38, respectively, within second differential input stage 14.

In the sense enable phase, a high logic level on SE2 places second enabling transistor 48 into a conducting state. Second enabling transistor 48 electrically short circuits node 46 to $V_{GND}$. This enables second differential input stage 14. Second enabling transistor 48 causes transistors 44 and 54 to source a finite amount of current to $V_{GND}$. The particular amount of current depends upon the voltages present on the input signals IN and $\overline{IN}$ and on the outputs of the first differential input stage 12. As described above, in connection with the set-up phase, the amount of current that transistors 44 and 54 source will cause a voltage differential between nodes 42 and 52. In addition, transistors 36 and 38 will each mirror the current sourced by transistors 20 and 22, respectively. The gain of transistors 36 and 38 with respect to transistors 20 and 22 may be increased or decreased by increasing or decreasing the width of the gates of transistors 36 and 38 with respect to transistors 20 and 22. The voltage differential between nodes 42 and 52 will be greater than the voltage differential between the two input signals, IN and $\overline{IN}$. The voltages at nodes 42 and 52 may be advantageously used as inputs to latch 16.

In the latch enable phase, a high voltage level on the timing signal LE places latch enabling transistor 56 into a conducting state. Latch enabling transistor 56 electrically short circuits the sources of transistors 58 and 60 to $V_{GND}$. Enabling transistor 56 therefore enables the operation of latch 16. A low voltage on SE1 and SE2 disables the first and second differential input stages in the latch enable phase. Timing signals LE and $\overline{LE}$ simultaneously configure sense amp 10 from a sensing mode to a latching mode. In particular, pass gate 40 isolates the gate of transistor 20 from the gate of transistor 36. Pass gate 50 also isolates the gate of transistor 22 from the gate of transistor 38. Pass gate 62 connects the gate of transistor 36 to node 52. Pass gate 64 connects the gate of transistor 38 to node 42. Transistors 36, 38, 58 and 60 make up a cross coupled latch. Latch 16 receives as inputs the differential voltage present on nodes 42 and 52, drives the voltage further apart and latches the full rail to rail complementary outputs on OUT and $\overline{OUT}$. A "full rail to rail complementary output" of latch 16 indicates that the voltage differential between OUT and $\overline{OUT}$ is generally equal to the voltage differential between the first and second supply voltages, $V_{DD}$ and $V_{GND}$.

Both first and second differential input stages generate an AC symmetric output. As described above, the first differential input stage biases the second differential input stage. The second differential input stage in turn provides inputs to latch 16. The use of two differential input stages and the symmetric nature of both of their outputs increase the performance of the amplification stage of sense amp 10 relative to other sensing configurations. A symmetric output from either differential input stage means that the magnitude of the voltage differential between nodes 24 and 26 or the magnitude of the voltage differential between nodes 42 and 52 is the same independent of whether IN is high or IN is low. In the case of first differential input stage 12, the magnitude of the voltage differential between node 24 and 26 may be as large as $(V_{DD}-V_{TH}-V_{GND})$ where $V_{TH}$ is a transistor threshold voltage. (In practice, the timing signal SE2 enables second enabling transistor 48 before the voltage difference between nodes 24 and 26 may be as large as $(V_{DD}-V_{TH}-V_{GND})$.) In the case of second differential input stage 14, the magnitude of the voltage differential between node 42 and 52 is $(V_{DD}-V_{GND})$. (In practice, the timing signal LE enables latch enabling transistor 56 before the voltage difference between nodes 42 and 52 reaches $(V_{DD}-V_{GND})$.) The symmetric nature of sense amp 10, however, makes sense amp 10 suitable where very high performance is required.

In certain applications it may be advantageous to operate sense amp 10 with only two timing signals and hence, in only two different phases. In this second embodiment, nodes 30 and 46 are electrically short circuited together and second enabling transistor 48 is omitted. The timing signal SE2 is therefore not needed. Transistors 36 and 38 continue to be configurable to act in either a sensing mode or in a latching mode as described above. The resulting circuit then has a single differential input stage drive latch 16. The single differential input stage generates a symmetric AC output for latch 16. The second embodiment of the disclosed invention is therefore also suitable for high performance applications.

It should be understood that the single differential input stage of the second embodiment has the same transistors connected in the same way as depicted in FIG. 1. The following description merely expresses the different operating characteristics of the second embodiment with a single sense enable timing signal.

In the second embodiment, the single differential input stage has a first and a second differential circuit that operate simultaneously to provide an AC symmetric input signal and the complement of the input signal to latch 16.

The first differential circuit is made up of transistors 20, 28, 36 and 44. Transistor 20 and transistor 36 act as a current master and a current slave, respectively, of a current mirror circuit within the first differential circuit. Transistors 28 and 44 acts as a differential input stage and generate a voltage differential between nodes 24 and 42 representative of the voltage difference between the input signals IN and $\overline{IN}$ as described above.

The second differential circuit has transistors 22, 34, 38 and 54. Transistor 22 and transistor 38 act as a current master and a current slave, respectively, of a current mirror circuit within the second differential circuit. Transistors 34 and 54 acts as a differential input stage and generate a voltage differential between nodes 26 and 52 representative of the voltage difference between the input signals IN and $\overline{IN}$ as described above.

Each differential circuit provides one input to latch 16. The first differential circuit generates an output at node 42. The second differential circuit generates an output at node 52. Although the first and second differential circuits are identical, the input signals IN and $\overline{IN}$ are connected to each circuit in an opposite manner. In particular, the input signal IN is connected to the current master side of the first differential circuit and to the current slave side of the second differential circuit. Similarly, the input signal $\overline{IN}$ is connected to the current slave side of the first differential circuit and to the current master side of the second differential circuit. As a result, the opposite side of each differential circuit has the high voltage or low voltage node. For instance, if the input signal IN is greater than the input signal $\overline{IN}$, then nodes 24 and 52 will have a lower voltage than nodes 26 and 42, respectively. The low voltage nodes are then on the current master side of the first differential circuit and on the current slave side of the second differential circuit. The term "side" refers to the sense amp and current mirror transistor pair that are connected source to drain, independent of any pass gates. For instance, transistors 20 and 28 are on the current master "side" of the first differential circuit. Transistors 38 and 54 are on the current slave "side" of the second differential circuit.

As depicted, only the voltages on nodes 42 and 52 are used as inputs to latch 16. For the reasons described above, one and only one of nodes 42 and 52 will be high during the latch enable phase. The other node will be low. One node therefore provides an input to latch 16 while the other provides the complement of the input to latch 16. The magnitude of the voltage differential between node 42 and 52 may be as large as $(V_{DD}-V_{GND})$ independent of whether the input IN is high or low. (In practice, the timing signal LE enables latch enabling transistor 56 before the voltage difference between nodes 42 and 52 reaches $(V_{DD}-V_{GND})$.) This configuration generates an AC symmetric input to latch 16.

Figure 2:
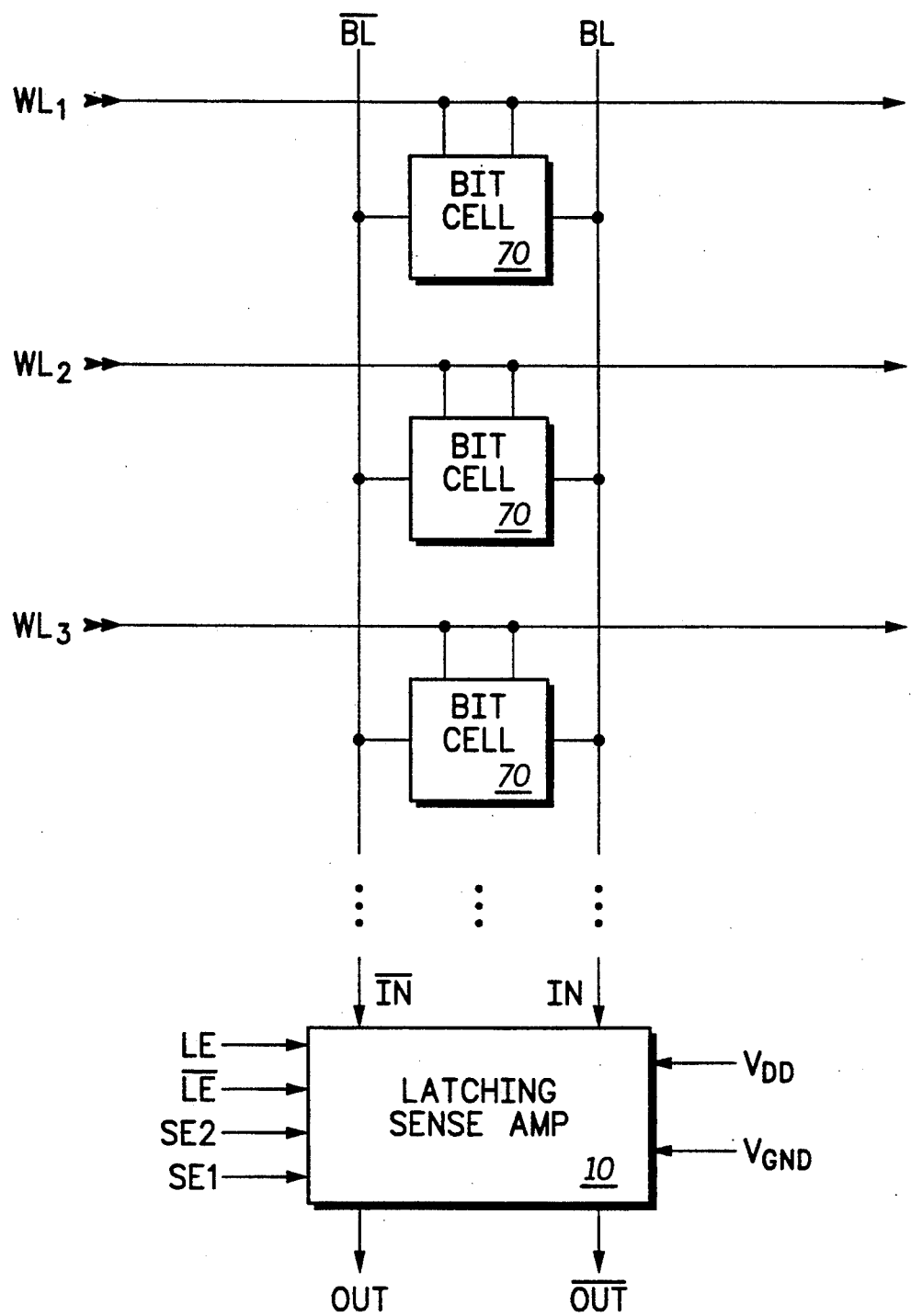
FIG. 2 depicts a partial block diagram of a memory system incorporating the latching sense amplifier depicted in FIG. 1.

FIG. 2 depicts a partial block diagram of a memory system 68 incorporating the latching sense amplifier 10 depicted in FIG. 1. In a typical memory system, sense amp 10 monitors the outputs from a column of memory bit cells 70. Memory system 68 typically is made up of many columns of bit cells and sense amps forming an N×M array of memory bits, where N and M are integers. Any type of bit cell circuitry may be used in a memory system incorporating the present invention. As is known in the art, a particular bit cell in a particular column is enabled by addressing a particular memory location. The memory address may be decoded by a decoder (not shown) which generates a suitable enabling signal on the appropriate write line (labeled WL$_1$, WL$_2$, etc.). Once enabled, a selected bit cell outputs two voltage levels on a bit line and a bit line bar (labeled BL and $\overline{BL}$, respectively). These voltage levels are representative of the logic level stored by the selected bit cell. Sense amp 10 then ensures that the output of a bit cell is rapid and is compatible with downstream logic circuits.

It is a first technical advantage of the disclosed invention that the sensing portion of each differential circuit generates a symmetric AC output. This type of output increases the speed performance of the invention and makes it suitable where very short response times are required.

It is a second technical advantage of the disclosed system that it incorporates an integral cross-coupled latch. An integrated latch further increases the speed performance of the invention and reduces its size relative to a non-integrated circuit.

It is a third technical advantage of the disclosed system that it requires less area than does a separate sense amp-latch combination. Although depicted with a similar number of components as a separate sense amp-latch combination, the disclosed invention substitutes small pass gates for large drive transistors.

It is a further technical advantage of the disclosed invention that it may be implemented with existing techniques. No new manufacturing methods or materials are required to practice the invention.

Although the present invention has been described with reference to a specific embodiment, further modifications and improvements will occur to those skilled in the art. For instance, sense amp 10 may be implemented with p channel transistors where FIG. 1 depicts n channel transistors and vice versa with appropriate modifications to the timing signals. Furthermore, the present invention may be implemented using media other than complementary metal oxide semiconductors. For instance, the disclosed invention may be practiced using bipolar or gallium arsenide technologies. The nomenclature source, drain, and gate therefore may unintentionally limit the scope of the invention to the described embodiment. Therefore, the claims will describe the source and drain interchangeably as a first current electrode and a second current electrode and the gate as a control electrode. It is to be understood that the invention encompasses all such modifications and embodiments that do not depart from the spirit and scope of the invention as defined in the appended claims.

What is claimed is:

1. A latching sense amplifier comprising:
   a first circuit generating a first pair of outputs, the first pair of outputs at a first and a second node representative of a voltage differential between a first and a second input voltage, wherein the first circuit comprises:
      the first, the second, a third and a fourth node, the third and fourth nodes receiving a first and second supply voltage, respectively;
      a first transistor comprising a first and a second current electrode and a control electrode, the first current electrode coupled to the third node, the second current electrode and the control electrode coupled to the first node:
      a second transistor comprising a first and a second current electrode and a control electrode, the first current electrode coupled to the first node, the second current electrode coupled to the fourth node and the control electrode coupled to the first input voltage;
      a third transistor comprising a first and a second current electrode and a control electrode, the first current electrode coupled to the third node, the second current electrode and the control electrode coupled to the second node:
      a fourth transistor comprising a first and a second current electrode and a control electrode, the first current electrode coupled to the second node, the second current electrode coupled to the fourth node and the control electrode coupled to the second input voltage:
   a second circuit coupled to the first circuit generating a second pair of outputs, the second pair of outputs representative of a voltage differential between the first and the second input voltages, wherein the second circuit comprises:
      a fifth, a sixth, a seventh, an eighth and a ninth node, the ninth node receiving the second supply voltage wherein the seventh and eighth nodes forming outputs of the latching sense amplifier;
      a fifth transistor comprising a first and a second current electrode and a control electrode, the first current electrode coupled to the third node, the second current electrode coupled to the seventh node and the control electrode coupled to the fifth node;
      a sixth transistor comprising a first and a second current electrode and a control electrode, the first current electrode coupled to the seventh node, the second current electrode coupled to the ninth node and the control electrode coupled to the second input voltage;
      a seventh transistor comprising a first and a second current electrode and a control electrode, the first current electrode coupled to the third node, the second current electrode coupled to the eighth node and the control electrode coupled to the sixth node;
      an eighth transistor comprising a first and a second current electrode and a control electrode, the first current electrode coupled to the eighth node, the second current electrode coupled to the ninth node and the control electrode coupled to the first input voltage;
   latching circuitry generating a third pair of outputs, the third pair of outputs representative of the voltage differential between the first and the second input voltages, wherein the latching circuitry comprises:
      a tenth node;
      a ninth transistor comprising a first and a second current electrode and a control electrode, the first current electrode coupled to the seventh node, the second current electrode coupled to the tenth node and the control electrode coupled to the eighth node; and
      a tenth transistor comprising a first and a second current electrode and a control electrode, the first current electrode coupled to the eighth node, the second current electrode coupled to the tenth node and the control electrode coupled to the seventh node; and
   switching circuitry coupled to the first circuit, to the second circuit and to the latching circuitry configuring the second circuit to operate in conjunction with the latching circuitry to form a latch.

2. The latching sense amplifier of claim 1 wherein the switching circuitry comprises:
   a first switching element for alternately coupling and uncoupling the first and fifth nodes;
   a second switching element for alternately coupling and uncoupling the second and sixth nodes;
   a third switching element for alternately coupling and uncoupling the fifth and eighth nodes; and
   a fourth switching element for alternately coupling and uncoupling the sixth and seventh nodes.

3. The latching sense amplifier of claim 2 further comprising:
   a first enable transistor comprising a first and a second current electrode and a control electrode, the first current electrode coupled to the fourth node, the second current electrode receiving the second supply voltage and the control electrode receiving a first enable signal; and a second enable transistor comprising a first and a second current electrode and a control electrode, the first current electrode coupled to the ninth node, the second current electrode receiving the second supply voltage and the control electrode receiving a second enable signal.

4. The latching sense amplifier of claim 2 further comprising:

a first enable transistor comprising a first and a second current electrode and a control electrode, the first current electrode coupled to the fourth and ninth nodes, the second current electrode receiving the second supply voltage and the control electrode coupled to a first enable signal.

5. A latching sense amplifier comprising:

a first circuit generating a first pair of outputs, the first pair of outputs at a first and a second node representative of a voltage differential between a first and a second input voltage, wherein the first circuit comprises:

the first, the second, a third and a fourth node, the third and fourth nodes receiving a first and second supply voltage, respectively;

a first transistor comprising a first and a second current electrode and a control electrode, the first current electrode coupled to the third node, the second current electrode and the control electrode coupled to the first node;

a second transistor comprising a first and a second current electrode and a control electrode, the first current electrode coupled to the first node, the second current electrode coupled to the fourth node and the control electrode coupled to the first input voltage;

a third transistor comprising a first and a second current electrode and a control electrode, the first current electrode coupled to the third node, the second current electrode and the control electrode coupled to the second node;

a fourth transistor comprising a first and a second current electrode and a control electrode, the first current electrode coupled to the second node, the second current electrode coupled to the fourth node and the control electrode coupled to the second input voltage;

a second circuit coupled to the first circuit generating a second pair of outputs, the second pair of outputs representative of a voltage differential between the first and the second input voltages, wherein the second circuit comprises:

a fifth, a sixth, a seventh, an eighth and a ninth node, the ninth node receiving the second supply voltage wherein the seventh and eighth nodes forming outputs of the latching sense amplifier;

a fifth transistor comprising a first and a second current electrode and a control electrode, the first current electrode coupled to the third node, the second current electrode coupled to the seventh node and the control electrode coupled to the fifth node;

a sixth transistor comprising a first and a second current electrode and a control electrode, the first current electrode coupled to the seventh node, the second current electrode coupled to the ninth node and the control electrode coupled to the second input voltage;

a seventh transistor comprising a first and a second current electrode and a control electrode, the first current electrode coupled to the third node, the second current electrode coupled to the eighth node and the control electrode coupled to the sixth node;

an eighth transistor comprising a first and a second current electrode and a control electrode, the first current electrode coupled to the eighth node, the second current electrode coupled to the ninth node and the control electrode coupled to the first input voltage;

latching circuitry generating a third pair of outputs, the third pair of outputs representative of the voltage differential between the first and the second input voltages;

switching circuitry coupled to the first circuit, to the second circuit and to the latching circuitry configuring the second circuit to operate in conjunction with the latching circuitry to form a latch, the switching circuitry comprising:

a first switching element for alternately coupling and uncoupling the the first and fifth nodes;

a second switching element for alternately coupling and uncoupling the second and sixth nodes;

a third switching element for alternately coupling and uncoupling the fifth and eighth nodes; and a fourth switching element for alternately coupling and uncoupling the sixth and seventh nodes.

6. The latching sense amplifier of claim 5 further comprising:

a first enable transistor comprising a first and a second current electrode and a control electrode, the first current electrode coupled to the fourth node, the second current electrode receiving the second supply voltage and the control electrode receiving a first enable signal; and a second enable transistor comprising a first and a second current electrode and a control electrode, the first current electrode coupled to the ninth node, the second current electrode receiving the second supply voltage and the control electrode receiving a second enable signal.

7. The latching sense amplifier of claim 5 further comprising:

a first enable transistor comprising a first and a second current electrode and a control electrode, the first current electrode coupled to the fourth and ninth nodes, the second current electrode receiving the second supply voltage and the control electrode coupled to a first enable signal.

8. A memory system comprising:

a plurality of memory bit cells, each one of the plurality of memory cells generating one of a plurality of voltage differentials, each one of the plurality of voltage differentials representative of one of a plurality of stored logic states;

circuitry coupled to the plurality of memory bit cells enabling one of the plurality memory bit cells responsive to input signals;

a sense amplifier coupled to the plurality of memory bit cells comprising:

a first circuit generating a first pair of outputs, the first pair of outputs at a first and a second node representative of a voltage differential between a first and a second input voltage, wherein the first circuit comprises:

the first, the second, a third and a fourth node, the third and fourth nodes receiving a first and second supply voltage, respectively;

a first transistor comprising a first and a second current electrode and a control electrode, the first current electrode coupled to the third node, the second current electrode and the control electrode coupled to the first node;

a second transistor comprising a first and a second current electrode and a control electrode, the first current electrode coupled to the first node, the second current electrode coupled to the fourth node and the control electrode coupled to the first input voltage;

a third transistor comprising a first and a second current electrode and a control electrode, the first current electrode coupled to the third node, the second current electrode and the control electrode coupled to the second node;

a fourth transistor comprising a first and a second current electrode and a control electrode, the first current electrode coupled to the second node, the second current electrode coupled to the fourth node and the control electrode coupled to the second input voltage;

a second circuit coupled to the first circuit generating a second pair of outputs, the second pair of outputs representative of a voltage differential between the first and the second input voltages, wherein the second circuit comprises:

a fifth, a sixth, a seventh, an eighth and a ninth node, the ninth node receiving the second supply voltage wherein the seventh and eighth nodes forming outputs of the latching sense amplifier;

a fifth transistor comprising a first and a second current electrode and a control electrode, the first current electrode coupled to the third node, the second current electrode coupled to the seventh node and the control electrode coupled to the fifth node;

a sixth transistor comprising a first and a second current electrode and a control electrode, the first current electrode coupled to the seventh node, the second current electrode coupled to the ninth node and the control electrode coupled to the second input voltage;

a seventh transistor comprising a first and a second current electrode and a control electrode, the first current electrode coupled to the third node, the second current electrode coupled to the eighth node and the control electrode coupled to the sixth node;

an eighth transistor comprising a first and a second current electrode and a control electrode, the first current electrode coupled to the eighth node, the second current electrode coupled to the ninth node and the control electrode coupled to the first input voltage;

latching circuitry generating a third pair of outputs, the third pair of outputs representative of the voltage differential between the first and the second input voltages, wherein the latching circuitry comprises: a tenth node;

a ninth transistor comprising a first and a second current electrode and a control electrode, the first current electrode coupled to the seventh node, the second current electrode coupled to the tenth node and the control electrode coupled to the eighth node;

a tenth transistor comprising a first and a second current electrode and a control electrode, the first current electrode coupled to the eighth node, the second current electrode coupled to the tenth node and the control electrode coupled to the seventh node; and switching circuitry coupled to the first circuit, to the second circuit and to the latching circuitry configuring the second circuit to operate in conjunction with the latching circuitry to form a latch.

9. The memory system of claim 8 wherein the switching circuitry comprises:

a first switching element for alternately coupling and uncoupling the first and fifth nodes;

a second switching element for alternately coupling and uncoupling the second and sixth nodes;

a third switching element for alternately coupling and uncoupling the fifth and eighth nodes; and a fourth switching element for alternately coupling and uncoupling the sixth and seventh nodes.

10. The memory system of claim 9 further comprising:

a first enable transistor comprising a first and a second current electrode and a control electrode, the first current electrode coupled to the fourth node, the second current electrode receiving the second supply voltage and the control electrode receiving a first enable signal; and a second enable transistor comprising a first and a second current electrode and a control electrode, the first current electrode coupled to the ninth node, the second current electrode receiving the second supply voltage and the control electrode receiving a second enable signal.

11. The memory system of claim 9 further comprising:

a first enable transistor comprising a first and a second current electrode and a control electrode, the first current electrode coupled to the fourth and ninth nodes, the second current electrode receiving the second supply voltage and the control electrode coupled to a first enable signal.

12. The memory system of claim 8 wherein the switching circuitry comprises:

a first enable transistor comprising a first and a second current electrode and a control electrode, the first current electrode coupled to the fourth node, the second current electrode receiving the second supply voltage and the control electrode receiving a first enable signal; and a second enable transistor comprising a first and a second current electrode and a control electrode, the first current electrode coupled to the ninth node, the second current electrode receiving the second supply voltage and the control electrode receiving a second enable signal.

13. The memory system of claim 8 further comprising:

a first enable transistor comprising a first and a second current electrode and a control electrode, the first current electrode coupled to the fourth and ninth nodes, the second current electrode receiving the second supply voltage and the control electrode coupled to a first enable signal.

14. The latching sense amplifier of claim 1 further comprising:
- a first enable transistor comprising a first and a second current electrode and a control electrode, the first current electrode coupled to the fourth node, the second current electrode receiving the second supply voltage and the control electrode receiving a first enable signal; and
- a second enable transistor comprising a first and a second current electrode and a control electrode, the first current electrode coupled to the ninth node, the second current electrode receiving the second supply voltage and the control electrode receiving a second enable signal.

15. The latching sense amplifier of claim 1 further comprising:
- a first enable transistor comprising a first and a second current electrode and a control electrode, the first current electrode coupled to the fourth and ninth nodes, the second current electrode receiving the second supply voltage and the control electrode coupled to a first enable signal.

* * * * *